(12) United States Patent
Hou et al.

(10) Patent No.: US 10,319,793 B2
(45) Date of Patent: Jun. 11, 2019

(54) METHOD FOR MANUFACTURING A DISPLAY SUBSTRATE BY PEELING AN ORGANIC LAYER

(71) Applicant: BOE TECHNOLOGY GROUP CO., LTD., Beijing (CN)

(72) Inventors: Wenjun Hou, Beijing (CN); Yingying Song, Beijing (CN)

(73) Assignee: BOE TECHNOLOGY GROUP 0CO., LTD., Beijing (CN)

( * ) Notice: Subject to any disclaimer, the term of this patent is extended or adjusted under 35 U.S.C. 154(b) by 142 days.

(21) Appl. No.: 15/322,372

(22) PCT Filed: Mar. 15, 2016

(86) PCT No.: PCT/CN2016/076371
§ 371 (c)(1),
(2) Date: Dec. 27, 2016

(87) PCT Pub. No.: WO2016/169358
PCT Pub. Date: Oct. 27, 2016

(65) Prior Publication Data
US 2018/0212002 A1   Jul. 26, 2018

(30) Foreign Application Priority Data

Apr. 20, 2015   (CN) .......................... 2015 1 0187636

(51) Int. Cl.
*H01L 51/00*      (2006.01)
*H01L 51/56*      (2006.01)
(Continued)

(52) U.S. Cl.
CPC ...... *H01L 27/3237* (2013.01); *H01L 51/0004* (2013.01); *H01L 51/0016* (2013.01);
(Continued)

(58) Field of Classification Search
CPC ............. H01L 27/3237; H01L 51/0004; H01L 51/0016; H01L 51/56
(Continued)

(56) References Cited

U.S. PATENT DOCUMENTS 5,943,550 A * 8/1999 Fulford, Jr. ............. H01L 22/20
148/DIG. 122
2009/0179550 A1   7/2009 Koo et al.
(Continued)

FOREIGN PATENT DOCUMENTS

CN          1628492 A      6/2005
CN        103270816 A      8/2013
(Continued)

OTHER PUBLICATIONS

Chinese First Office Action for Chinese Application No. 201510187636. 6, dated Nov. 25, 2015, 7 Pages.
(Continued)

*Primary Examiner* — Robert T Huber
(74) *Attorney, Agent, or Firm* — Brooks Kushman P.C.

(57) ABSTRACT

The present disclosure discloses a method for manufacturing a display substrate, including: forming an organic thin film layer by coating a conductive organic material on a base substrate at a region which corresponds to a non-display region of a to-be-formed display substrate; forming a pixel definition layer on the base substrate; printing an organic functional layer within a pixel region defined by the pixel definition layer on the base substrate; and removing the organic functional layer at the non-display region by peeling off the organic thin film layer. The peeling off the organic thin film layer includes: connecting two ends of the organic thin film layer to two electrodes of a power supply, respectively; and breaking an interface between the organic thin film layer and the pixel definition layer with joule heat
(Continued)

generated by the organic thin film layer when the organic thin film layer is powered.

8 Claims, 3 Drawing Sheets

(51) Int. Cl.
H01L 27/32 (2006.01)
H01L 51/50 (2006.01)
H01L 51/52 (2006.01)

(52) U.S. Cl.
CPC ...... *H01L 51/5056* (2013.01); *H01L 51/5088* (2013.01); *H01L 51/5221* (2013.01); *H01L 51/56* (2013.01); *H01L 27/3246* (2013.01)

(58) Field of Classification Search
USPC .............................................. 257/40; 438/99
See application file for complete search history.

(56) References Cited

U.S. PATENT DOCUMENTS

| | | | | |
|---|---|---|---|---|
| 2012/0156625 | A1* | 6/2012 | Chang | G03F 7/0043 430/325 |
| 2013/0112958 | A1* | 5/2013 | Li | H01L 27/3211 257/40 |
| 2013/0295705 | A1* | 11/2013 | Sonoda | H01L 51/0011 438/34 |
| 2013/0341607 | A1* | 12/2013 | Heo | H01L 51/56 257/40 |
| 2014/0097413 | A1* | 4/2014 | Chen | H01L 51/56 257/40 |
| 2014/0099738 | A1 | 4/2014 | Lee et al. | |
| 2014/0138673 | A1* | 5/2014 | Shieh | H01L 29/66969 257/43 |

FOREIGN PATENT DOCUMENTS

| | | |
|---|---|---|
| CN | 103346123 A | 10/2013 |
| CN | 103515413 A | 1/2014 |
| CN | 104766931 A | 7/2015 |

OTHER PUBLICATIONS

Chinese Second Office Action for Chinese Application No. 201510187636.6, dated Feb. 6, 2016, 3 Pages.
International Search Report and Written Opinion for Application No. PCT/CN2016/076371, dated Mar. 15, 2016, 13 Pages.

* cited by examiner

--Prior art--

METHOD FOR MANUFACTURING A DISPLAY SUBSTRATE BY PEELING AN ORGANIC LAYER

CROSS-REFERENCE TO RELATED APPLICATIONS

This application is the U.S. national phase of PCT Application No. PCT/CN2016/076371 filed on Mar. 15, 2016, which claims priority to Chinese Patent Application No. 201510187636.6 filed on Apr. 20, 2015, the disclosures of which are incorporated in their entirety by reference herein.

TECHNICAL FIELD

The present disclosure relates to the field of liquid-crystal display technology, in particular to a method for manufacturing a display substrate, a display substrate and a display device.

BACKGROUND

Comparing with a liquid crystal display (LCD), an organic light emitting diode (OLED), has advantages such as fast response, wide-angle view, high brightness, bright color, thinness, and is considered to be a next generation display technology.

For OLED or a polymer light emitting diode (PLED), there are two methods for forming an organic thin film layer.

First Method: Vacuum Evaporation

The first method is suitable for forming an organic thin film layer by using organic small molecular material. The first method has characteristic such as no solvent required to form the organic thin film layer and the formed organic thin film layer having a uniform thickness. However, the vacuum evaporation has disadvantages of high equipment investment and low material utilization, and is not suitable for production of a large-size product.

Second Method: Solution Process.

The second method specifically includes an inkjet printing process, a spin-coating process, a nozzle-coating process, etc. The second method is suitable for forming an organic thin film layer by using polymeric material and soluble small molecules. The second method has advantages of low equipment investment and has outstanding advantages in large-scale production of large-size products.

A continuous printing technique, which is one of the most important techniques in the solution process, has advantages of simple device and fast printing speed. In a printing process, a nozzle moves back and forth at a fast speed. As shown in FIG. 1, one problem of the continuous printing technique is that a printed organic functional thin film 3 may appear in a non-display region.

Currently, the organic functional thin film in the non-display region is removed by means of plasma etching, laser etching, solvent cleaning, etc., but by adopting the aforementioned cleaning methods, particles are introduced, which affects display effect.

SUMMARY

An object of the present disclosure is to provide a method for manufacturing a display substrate, a display substrate and a display device, so as to remove an organic functional layer printed within a non-display region, without introducing particles which affects display effect.

To achieve the above-mentioned object, the present disclosure provides a method for manufacturing a display substrate includes: forming an organic thin film layer on a base substrate at a region which corresponds to a non-display region of a to-be-formed display substrate; printing an organic functional layer on the base substrate; and removing the organic functional layer at the non-display region by peeling off the organic thin film layer.

Further, the organic functional layer includes a hole injection layer, a hole transporting layer and a light emitting layer.

Further, the organic thin film layer has a thickness of 3 micrometers to 20 micrometers.

Further, after the forming the organic thin film layer on the base substrate at the region which corresponds to the non-display region of the to-be-formed display substrate, the method further includes: forming a pixel definition layer on the base substrate. The printing the organic functional layer on the base substrate includes: printing the organic functional layer within a pixel region defined by the pixel definition layer.

Further, the forming the pixel definition layer on the base substrate includes: coating photoresist with hydrophobicity on the base substrate by spin coating, blade coating or slot coating; and forming the pixel definition layer by pre-baking, exposing, developing and post-baking the photoresist in sequence.

Further, the printing the organic functional layer within the pixel region defined by the pixel definition layer includes: continuously printing the organic functional layer within the pixel region defined by the pixel definition layer.

Further, the forming the organic thin film layer on the base substrate at the region which corresponds to the non-display region of the to-be-formed display substrate includes: coating an organic material on the base substrate at the region which corresponds to the non-display region of the to-be-formed display substrate by means of slot coating and inkjet printing, thereby forming the organic thin film layer.

Further, the organic material is conductive; and the peeling off the organic thin film layer includes: connecting two ends of the organic thin film layer to two electrodes of a power supply, respectively; and breaking an interface between the organic thin film layer and the pixel definition layer with joule heat generated by the organic thin film layer when the organic thin film layer is powered.

Further, the peeling off the organic thin film layer includes: irradiating the base substrate with ultraviolet rays; breaking an interface between the organic thin film layer and the pixel definition layer with energy generated by the ultraviolet rays; and mechanically peeling off the organic thin film layer.

Further, after the removing the organic functional layer at the non-display region by peeling off the organic thin film layer, the method further includes: forming an electron transporting layer, an electron injection layer and a cathode metal layer by vacuum evaporation.

To achieve the above-mentioned object, the present disclosure also provides a display substrate. The display substrate is manufactured by adopting any aforementioned manufacturing method.

To achieve the above-mentioned object, the present disclosure also provides a display device. The display device includes the aforementioned display substrate.

According to the embodiments of the present disclosure, an organic thin film layer is first formed on the base substrate at the region which corresponds to the non-display region of the to-be-formed display substrate, then an organic functional layer is printed on the base substrate, and finally the organic functional layer of the non-display region is removed by peeling off the organic thin film layer. The above process is simple and effective without introducing particles which affects display effect.

DETAILED DESCRIPTION

In order to make the objects, the technical solutions and the advantages of the present disclosure more apparent, the present disclosure will be described hereinafter in conjunction with the drawings and embodiments.

Figure 1:
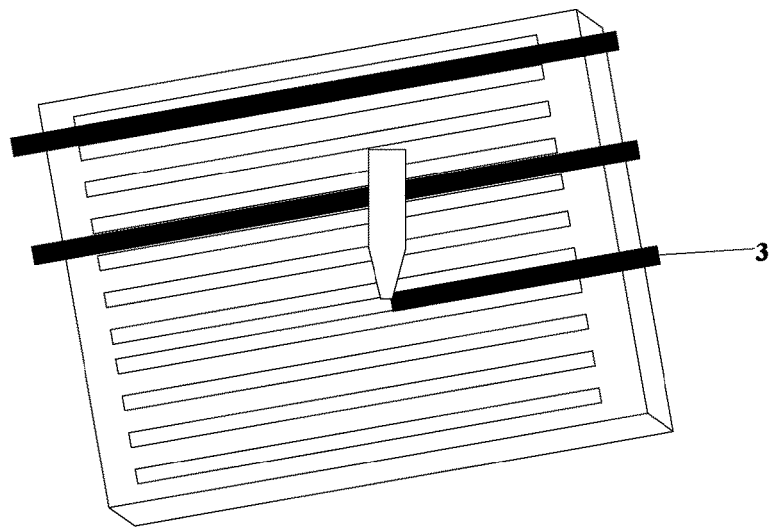
FIG. 1 is a schematic view of a method for manufacturing an organic thin film layer by means of continuous printing in the related art.
Figure 2:
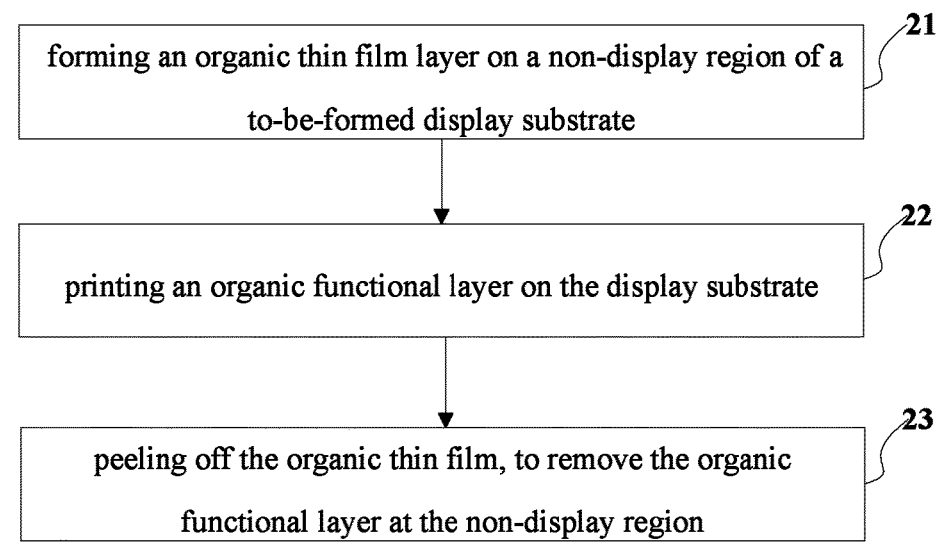
FIG. 2 is a flow chart of a method for manufacturing a display substrate according to an embodiment of the present disclosure.

Embodiments of the present disclosure provide a method for manufacturing a display substrate, as shown in FIG. 2, the method includes the following steps.

Step 21 is to form an organic thin film layer on a base substrate at a region which corresponds to a non-display region of a to-be-formed display substrate.

Step 22 is to print an organic functional layer on the base substrate.

Step 23 is to remove the organic functional layer at the non-display region by peeling off the organic thin film layer.

In some embodiments, the base substrate may be a glass substrate, a plastic substrate or a metal substrate. The base substrate also may be a glass substrate, a resin substrate or a metal substrate, on which components have been formed, such as a plastic substrate that is plated with a thin film of a dense dielectric material.

The above process can remove the organic functional layer printed to the non-display region without introducing particles which affects display effect.

The above method is described in details hereinafter in conjunction with FIGS. 3a-3d.

Figure 3A:
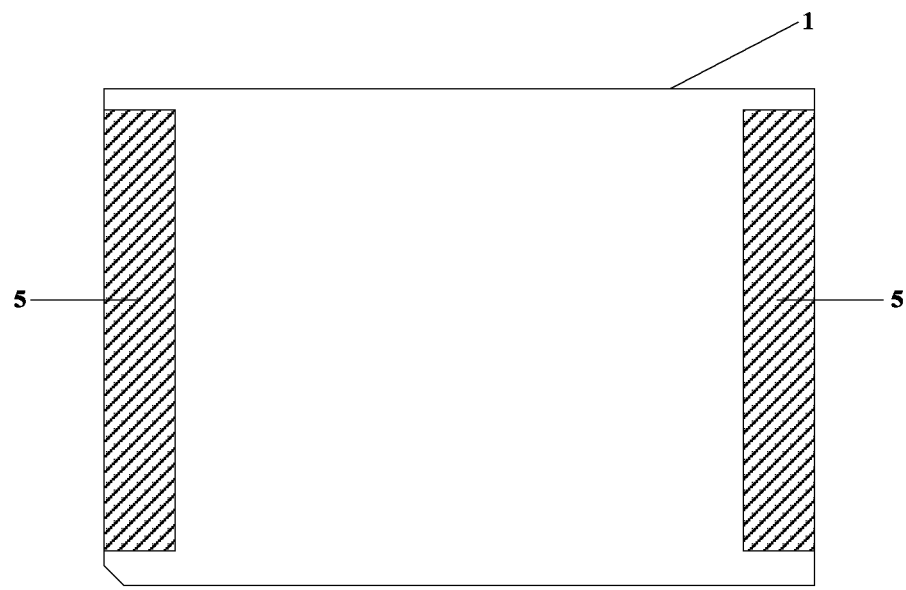
FIGS. 3a-3d are schematic views illustrating a process of manufacturing a display substrate according to an embodiment of the present disclosure.

Embodiments of the present disclosure provide a method for manufacturing a display substrate, and as shown in FIG. 3a, an organic thin film layer 5 is first formed on a base substrate 1 at a region which corresponds to a non-display region of a to-be-formed display substrate. Specifically, an organic material may be coated on the base substrate 1 at the region which corresponds to the non-display region of the to-be-formed display substrate by means of slot coating and inkjet printing, thereby forming the organic thin film layer 5. Optionally, after annealing treatment, the organic thin film layer 5 has a thickness of 3 micrometers to 20 micrometers.

Figure 3B:
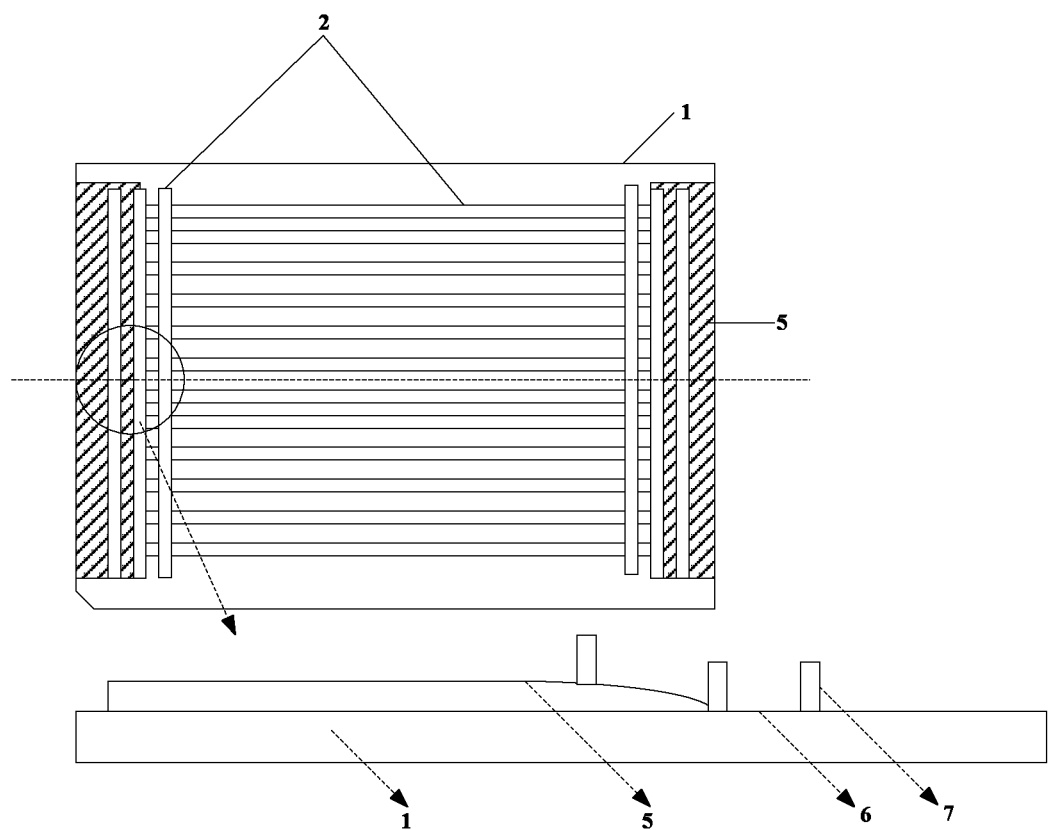

In order to enable ink droplets to be accurately injected into specified pixel regions, a pixel definition layer needs to be manufactured on the base substrate. In addition, if the pixel definition layer 2 (as shown in FIG. 3b) is formed first and then the organic thin film layer 5 is formed, an edge of the pixel definition layer may be smoothed when the organic thin film layer is formed, and then ink may flow back into a display region when the ink is continuously printed on the organic thin film layer, resulting in poor uniformity of the thickness of the organic functional layer at the edge of the display region. Therefore, it is desired to form the organic thin film layer 5 first and then form the pixel definition layer 2. That is, after the step 21 is performed, the method further include step 210.

Step 210 is to form the pixel definition layer 2 on the base substrate 1, as shown in FIG. 3b. The step 210 specifically includes: coating photoresist with hydrophobicity on the base substrate by spin coating, blade coating or slot coating; and forming the pixel definition layer by pre-baking, exposing, developing and post-baking the photoresist in sequence.

As shown in FIG. 3b, a part of pixel partition walls 7 of the pixel definition layer 2 is formed outside of the pixel region 6, for example, on the organic thin film layer 5.

Figure 3C:
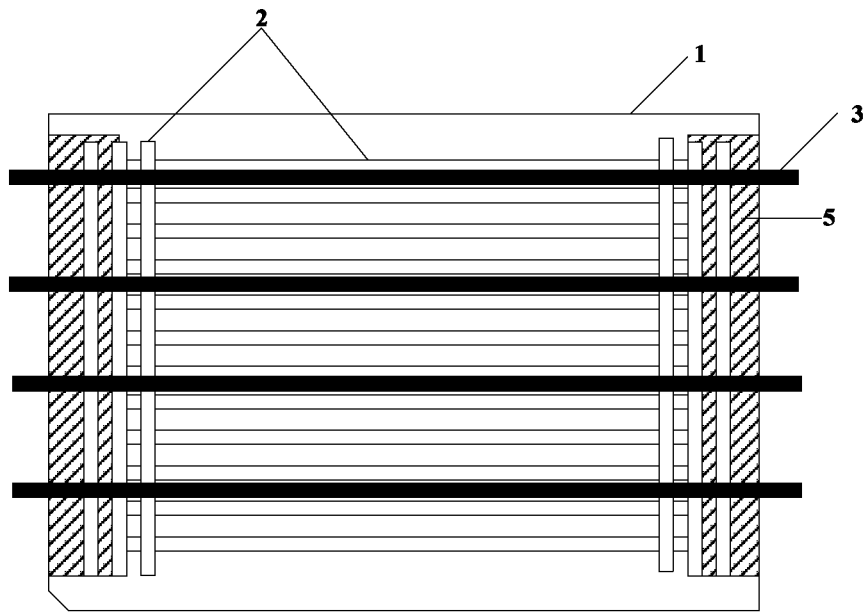

After forming the pixel definition layer 2, the step 22 is performed. Specifically, as shown in FIG. 3C, the organic functional layer 3 is printed within the pixel region defined by the pixel definition layer 2.

Optionally, the organic functional layer 3 is printed by means of continuous printing. The organic functional layer 3 includes a hole injection layer, a hole transporting layer and a light emitting layer. At this point, the ink at the organic functional layer 3 which is in the non-display region, remains on the organic thin film layer 5.

Finally, the step 23 is performed. The organic functional layer 3 at the non-display region is removed by peeling off the organic thin film layer 5. Meanwhile, the pixel partition walls 7, which are formed on the organic thin film layer 5, are also removed. Optionally, the organic thin film layer 5 may be peeled off in the following ways.

First Way

When the organic thin film layer 5 is made of conductive organic material, the step 23 may include: connecting two ends of the organic thin film layer 5 to two electrodes of a power supply, respectively, and breaking an interface between the organic thin film layer 5 and the pixel definition layer 2 with joule heat generated by the organic thin film layer 5 when the organic thin film layer 5 is powered, thereby peeling off the organic thin film layer 5.

The organic thin film layer 5 is powered to form a circuit loop. Heat is generated when current flows through the conductive organic material. The interface between the organic thin film layer 5 and the pixel definition layer 2 is broken by the joule heat, thereby separating the organic thin film layer 5 from the pixel definition layer 2, as shown in FIG. 3d.

Second Way

Figure 3D:
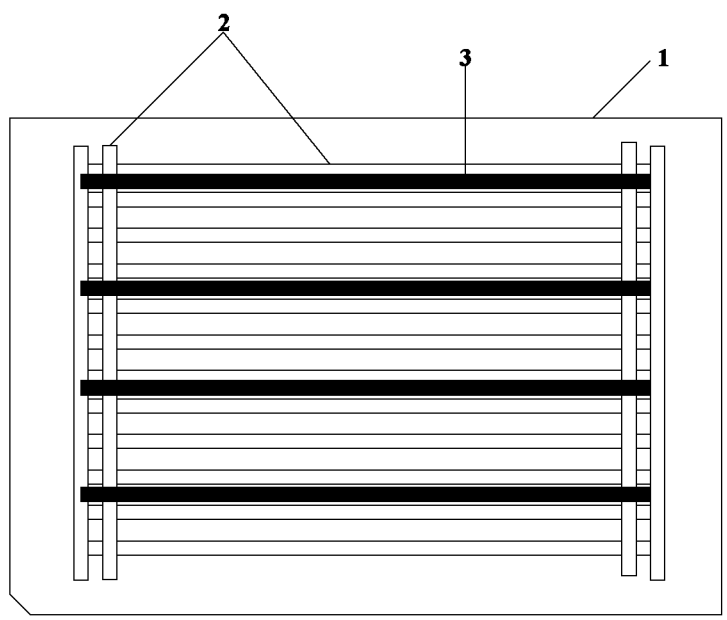

The step 23 may include: irradiating the base substrate 1 with ultraviolet rays, breaking an interface between the organic thin film layer 5 and the pixel definition layer 2 with energy generated by the ultraviolet rays, and mechanically peeling off the organic thin film layer 5, which are also as shown in FIG. 3d.

According to the embodiments of the present disclosure, the organic thin film layer 5 may be peeled off by the aforementioned ways, so that the organic functional layer 3 at the non-display region is removed without introducing any particles in the process.

Of course, after the organic thin film layer 5 is peeled off, it is desired to form other OLED functional layers and a cathode through evaporation. The method further includes step 24. The step 24 is to form an electron transporting layer, an electron injection layer and cathode metal layer through vacuum evaporation.

The display substrate can be manufactured through the above steps, which can remove the organic functional layer that is formed in the non-display when the organic functional layer is formed through printing continuously. Further, the process is simple and effective without introducing particles, and the display effect is not affected.

Embodiments of the present disclosure further provide a display substrate. The display substrate is manufactured by adopting any of the above-mentioned methods.

Embodiments of the present disclosure further provide a display device. The display device includes the above display substrate.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. A method for manufacturing a display substrate, comprising:
   forming an organic thin film layer on a base substrate at a region which corresponds to a non-display region of a to-be-formed display substrate;
   printing an organic functional layer on the base substrate; and
   removing the organic functional layer at the non-display region by peeling off the organic thin film layer;
   wherein after the forming the organic thin film layer on the base substrate at the region which corresponds to the non-display region of the to-be-formed display substrate, the method further comprises: forming a pixel definition layer on the base substrate; and
   wherein the printing the organic functional layer on the base substrate comprises: printing the organic functional layer within a pixel region defined by the pixel definition layer;
   wherein the forming the organic thin film layer on the base substrate at the region which corresponds to the non-display region of the to-be-formed display substrate comprises:
   coating an organic material on the base substrate at the region which corresponds to the non-display region of the to-be-formed display substrate by means of slot coating and inkjet printing, thereby forming the organic thin film layer;
   wherein the organic material is conductive; and the peeling off the organic thin film layer comprises:
   connecting two ends of the organic thin film layer to two electrodes of a power supply, respectively; and
   breaking an interface between the organic thin film layer and the pixel definition layer with joule heat generated by the organic thin film layer when the organic thin film layer is powered.

2. The method according to claim 1, wherein the organic functional layer comprises a hole injection layer, a hole transporting layer and a light emitting layer.

3. The method according to claim 1, wherein the organic thin film layer has a thickness of 3 micrometers to 20 micrometers.

4. The method according to claim 1, wherein the forming the pixel definition layer on the base substrate comprises:
   coating photoresist with hydrophobicity on the base substrate by spin coating, blade coating or slot coating; and
   forming the pixel definition layer by pre-baking, exposing, developing and post-baking the photoresist in sequence.

5. The method according to claim 4, wherein the printing the organic functional layer within the pixel region defined by the pixel definition layer comprises:
   continuously printing the organic functional layer within the pixel region defined by the pixel definition layer.

6. The method according to claim 1, wherein the printing the organic functional layer within the pixel region defined by the pixel definition layer comprises:
   continuously printing the organic functional layer within the pixel region defined by the pixel definition layer.

7. A display substrate manufactured by adopting the method according to claim 1.

8. A display device, comprising: the display substrate according to claim 7.

* * * * *

UNITED STATES PATENT AND TRADEMARK OFFICE
CERTIFICATE OF CORRECTION

| | |
|---|---|
| PATENT NO. | : 10,319,793 B2 |
| APPLICATION NO. | : 15/322372 |
| DATED | : June 11, 2019 |
| INVENTOR(S) | : Wenjun Hou and Yingying Song |

It is certified that error appears in the above-identified patent and that said Letters Patent is hereby corrected as shown below:

On the Title Page

Delete:
"(73) Assignee: BOE TECHNOLOGY GROUP 0CO., LTD., Beijing (CN);"

And Insert:
--(73) Assignee: BOE TECHNOLOGY GROUP CO., LTD., Beijing (CN);--

Signed and Sealed this
Twenty-second Day of October, 2019

Andrei Iancu
*Director of the United States Patent and Trademark Office*